(12) United States Patent
Nakanishi et al.

(10) Patent No.: US 7,498,898 B2
(45) Date of Patent: Mar. 3, 2009

(54) SURFACE ACOUSTIC WAVE FILTER, AND SAW DUPLEXER

(75) Inventors: Hidekazu Nakanishi, Osaka (JP); Ryoichi Takayama, Osaka (JP); Yukio Iwasaki, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 252 days.

(21) Appl. No.: 10/587,240

(22) PCT Filed: Feb. 2, 2005

(86) PCT No.: PCT/JP2005/001859

§ 371 (c)(1),
(2), (4) Date: Jul. 26, 2006

(87) PCT Pub. No.: WO2005/076473

PCT Pub. Date: Aug. 18, 2005

(65) Prior Publication Data

US 2007/0152774 A1    Jul. 5, 2007

(30) Foreign Application Priority Data

Feb. 6, 2004 (JP) .............................. 2004-030327

(51) Int. Cl.
*H03H 9/72* (2006.01)
*H03H 9/64* (2006.01)

(52) U.S. Cl. ...................... 333/133; 333/195; 333/193; 310/313 D

(58) Field of Classification Search ................. 333/193, 333/195, 133
See application file for complete search history.

(56) References Cited

U.S. PATENT DOCUMENTS

| 5,115,216 | A | * | 5/1992 | Hikita et al. ................. 333/195 |
| 5,471,178 | A | * | 11/1995 | Hickernell ................... 333/193 |
| 5,654,680 | A | * | 8/1997 | Kwan et al. .................. 333/195 |
| 5,726,610 | A | * | 3/1998 | Allen et al. .................. 333/133 |
| 6,201,457 | B1 | * | 3/2001 | Hickernell ................... 333/193 |
| 2002/0109561 | A1 | * | 8/2002 | Iwamoto et al. ............. 333/133 |
| 2002/0140519 | A1 | * | 10/2002 | Takayama et al. ........... 333/133 |

FOREIGN PATENT DOCUMENTS

| JP | 9-107268 | 4/1997 |
| JP | 2000-068784 | 3/2000 |
| JP | 2000-196409 | 7/2000 |
| JP | 2002-330055 | 11/2002 |
| JP | 2003-051731 | 2/2003 |
| JP | 2003-060476 | 2/2003 |

* cited by examiner

*Primary Examiner*—Barbara Summons
(74) *Attorney, Agent, or Firm*—Wenderoth, Lind & Ponack, L.L.P.

(57) ABSTRACT

A plurality of surface acoustic wave resonators including a comb electrode and a grating reflector are coupled on a piezoelectric substrate. Dielectric film is formed on the surface of at least one surface acoustic wave resonator. No dielectric film is formed on the surface of at least one other surface acoustic wave resonator. Thus, a SAW filter where the insertion loss into a pass band is small, the steepness is sufficient, and the band is wide can be obtained.

8 Claims, 6 Drawing Sheets

SURFACE ACOUSTIC WAVE FILTER, AND SAW DUPLEXER

BACKGROUND OF THE INVENTION

1. Technical Field

The present invention relates to a surface acoustic wave filter used for an electronic device and to a SAW duplexer using the filter.

2. Background Art

Recently, the variety of communication systems used for portable phones has been increased. In a US-made PCS (Personal Communication Services) system, namely one of the communication systems, the cross band between the transmission band and reception band is set to be extremely narrow, namely 20 MHz. Accordingly, a band pass filter that has a broad pass band width and a large attenuation in extremely close proximity to the pass band is greatly required. A SAW duplexer used for such an application requires small insertion loss and sufficient suppression in the band of the other party. The band of the other party of a transmitting filter of a SAW duplexer is the reception band, and the band of the other party of a receiving filter is the transmission band. Therefore, a SAW duplexer is required to have a filter characteristic having a steep frequency characteristic in the cross band.

A surface acoustic wave filter (hereinafter referred to as "SAW filter") is well known as one of the filters having a steep filter characteristic. A SAW filter, however, has a temperature coefficient of frequency depending on an employed piezoelectric substrate. The temperature coefficient of frequency of a GHz-band SAW filter employing a generally used lithium tantalate substrate, for example, is −40 through −35 ppm/° C. Therefore, for realizing a SAW duplexer employing a SAW filter that is used in a communication system such as PCS having a narrow cross band, the temperature coefficient of frequency of the SAW filter must be improved.

The following structure is known in order to provide a surface acoustic wave device that has a relatively good temperature coefficient of frequency and broadband characteristic. In this structure, a silicon dioxide ($SiO_2$) film is formed on the surfaces of surface acoustic wave resonators forming at least one SAW filter that is disposed on a piezoelectric substrate, and the surface acoustic wave resonators are interconnected by at least one of a series connecting method and a parallel connecting method. Thus, a target surface acoustic wave device is realized.

Japanese Patent Unexamined Publication No. 2003-60476 discloses the following surface acoustic wave device. This surface acoustic wave device has the following elements:

at least one surface acoustic wave filter formed on a piezoelectric substrate; and one-port surface acoustic wave resonators that are formed on the piezoelectric substrate and are connected to the SAW filter by at least one of a series connecting method and a parallel connecting method.

A film having a positive temperature coefficient of frequency is formed so as to cover at least one of the surface acoustic wave resonators except for the part having the SAW filter. Forming the film having the positive temperature coefficient of frequency aims to improve the temperature coefficient of frequency, suppress the degradation of insertion loss into a pass band, and widen the pass band.

In a conventional surface acoustic wave device, however, a longitudinally coupled mode SAW filter is employed as the SAW filter formed on the piezoelectric substrate. The longitudinally coupled mode SAW filter, which has been recently significantly improved, suffers a large insertion loss compared to a ladder type SAW filter that uses a surface acoustic wave resonator as the impedance element. It is thus difficult to apply a longitudinally coupled mode SAW filter to a SAW duplexer where insertion loss is required to be small. A surface acoustic wave resonator having a silicon dioxide ($SiO_2$) film is connected in this document, so that the insertion loss further increases.

The longitudinally coupled mode SAW filter structured in one stage hardly has sufficient suppression, so the filter is generally structured in two or more stages. In a structure of two or more stages, the insertion loss nearly doubles, and hence the application to the SAW duplexer further becomes difficult. Further, in the longitudinally coupled mode SAW filter increase of the degree of suppression is difficult on the high frequency side of the pass band. Therefore, it is difficult to employ a longitudinally coupled mode SAW filter as the transmission filter of the PCS system.

The present invention addresses the conventional problems, and provides a SAW filter that has a high temperature coefficient of frequency and suffers extremely small insertion loss into the pass band. By employing the SAW filter, a SAW duplexer is provided which has a steep frequency characteristic in the cross band and a large degree of suppression in the band of the other party and prevents a signal from leaking to the band of the other party.

SUMMARY OF THE INVENTION

A SAW filter of the present invention has a plurality of surface acoustic wave resonators interconnected on a piezoelectric substrate. Each surface acoustic wave resonator is formed of a comb electrode and a grating reflector. A dielectric film is formed on the surface of at least one of the surface acoustic wave resonators, and no dielectric film is formed on the surface of at least another one of the surface acoustic wave resonators.

By this structure, a SAW filter where insertion loss into a pass band is small, the steepness is sufficient, and the pass band is wide can be obtained.

In the structure, the capacitance ratio of the surface acoustic wave resonator having the dielectric film may be made higher than that of the surface acoustic wave resonator having no dielectric film.

By this structure, a filter characteristic where the frequency characteristic is steeper can be realized.

In the structure, the resonance frequency of the surface acoustic wave resonator having the dielectric film may be made higher than that of the surface acoustic wave resonator having no dielectric film.

By this structure, the steepness of the filter characteristic on the high-frequency side of the pass band can be improved.

In the structure, the resonance frequency of the surface acoustic wave resonator having the dielectric film may be made lower than that of the surface acoustic wave resonator having no dielectric film.

By this structure, the steepness of the filter characteristic on the low-frequency side of the pass band can be improved.

In the structure, the surface acoustic wave resonators may be interconnected in series and in parallel to form a ladder type filter, and a dielectric film may be formed on at least one of the surface acoustic wave resonators interconnected in series or on at least one of the surface acoustic wave resonators interconnected in parallel.

By this structure, the steepness of the filter characteristic on the high-frequency side or low-frequency side of the pass band can be improved, and the suppression is increased.

In the structure, the dielectric film may be a silicon dioxide film. Thus, a SAW filter where the temperature coefficient of frequency is improved, the insertion loss into a pass band is small, the steepness is sufficient, and the pass band is wide can be obtained.

A SAW duplexer of the present invention employs the above-mentioned SAW filter, but may employ the ladder-type SAW filter. Thus, a SAW duplexer applicable to a communication system such as a PCS system where the pass band is wide and the cross band is narrow can be easily realized.

The SAW duplexer of the present invention includes a transmission filter, a reception filter, and a phase shifter. The transmission filter and reception filter have a ladder-type structure where surface acoustic wave resonators are interconnected in series and in parallel. Depending on which side of each pass band requires a steeper filter characteristic, a dielectric film is formed on at least one of the surface acoustic wave resonators interconnected in series, or on at least one of the surface acoustic wave resonators interconnected in parallel.

By this structure, a SAW duplexer applicable to a communication system such as a PCS system where the pass band is wide and the cross band is narrow can be easily realized.

In the structure, the SAW duplexer has a frequency allocation where the transmission band lies on the low frequency side and the reception band lies on the high frequency side. In the transmission filter, a dielectric film may be formed on at least one of the surface acoustic wave resonators interconnected in series. In the reception filter, a dielectric film may be formed on at least one of the surface acoustic wave resonators interconnected in parallel.

By this structure, a SAW duplexer applicable to a PCS system can be easily realized.

In the structure, the SAW duplexer has a frequency allocation where the transmission band lies on the high frequency side and the reception band lies on the low frequency side. In the transmission filter, a dielectric film may be formed on at least one of the surface acoustic wave resonators interconnected in parallel. In the reception filter, a dielectric film may be formed on at least one of the surface acoustic wave resonators interconnected in series.

By this structure, a SAW duplexer having a good characteristic can be applied also to a communication system having the frequency allocation where the transmission band lies on the high frequency side and the reception band lies on the low frequency side.

The SAW filter of the present invention can have a good temperature coefficient of frequency and a small insertion loss into a pass band, because a dielectric film is formed on at least one of the surface acoustic wave resonators forming the SAW filter on a piezoelectric substrate. By employing such a SAW filter, a SAW duplexer where the steepness is sufficient even in a narrow cross band and the suppression in the pass band on the other party is large can be realized advantageously.

DETAILED DESCRIPTION OF PREFERRED EMBODIMENTS

Exemplary embodiments of the present invention will be described in detail with reference to the drawings. Same elements are denoted with the same reference marks, and the descriptions of those elements are omitted. The plan views, or the like, of SAW filters are schematically described, and the number of electrode fingers of a series resonator and a parallel resonator is roughly described.

First Exemplary Embodiment

Figure 1:
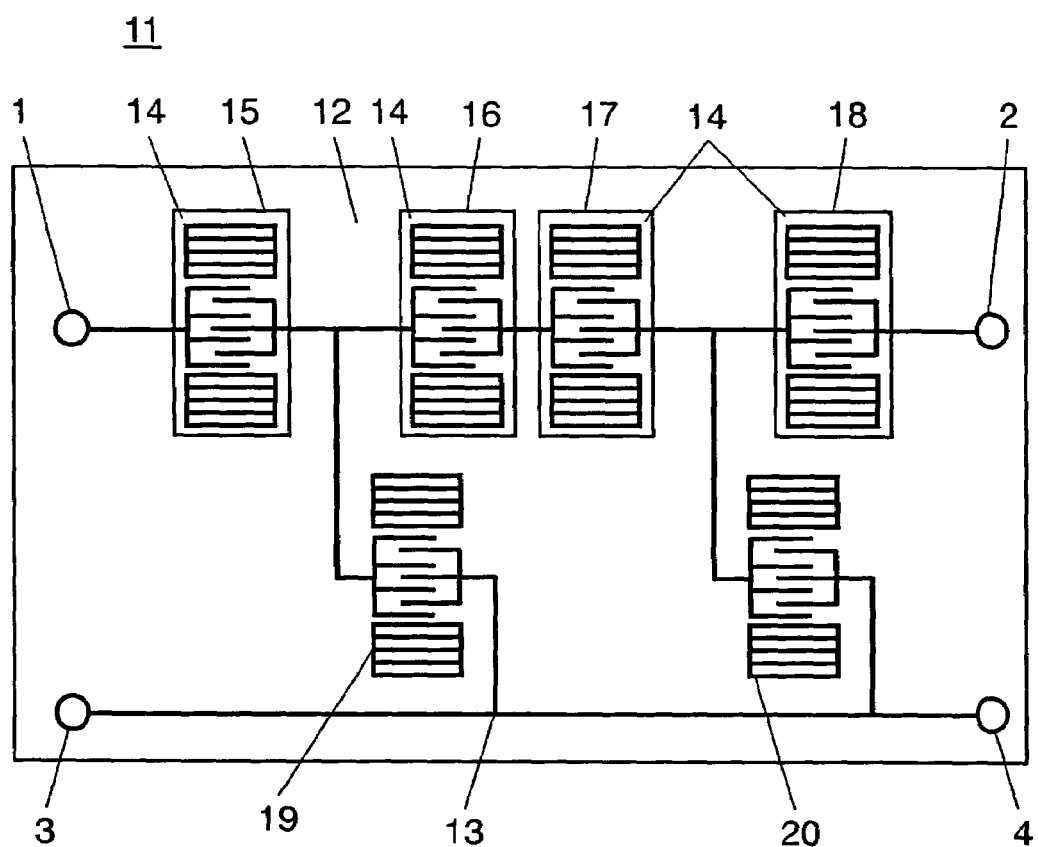
FIG. 1 is a plan view of a SAW filter in accordance with a first exemplary embodiment of the present invention.

FIG. 1 is a plan view of SAW filter 11 in accordance with a first exemplary embodiment of the present invention. In the first exemplary embodiment, as SAW filter 11 where a plurality of surface acoustic wave resonators are interconnected, a ladder type SAW filter where the surface acoustic wave resonators are interconnected in series and in parallel is described as an example.

In FIG. 1, SAW filter 11 employs a 39°Y cut X propagation lithium tantalate ($LiTaO_3$) substrate as piezoelectric substrate 12. One-port surface acoustic wave resonators 15 through 20 having comb electrodes and grating reflectors are formed on piezoelectric substrate 12. Surface acoustic wave resonators 15 through 18 are interconnected in series, and surface acoustic wave resonators 19 and 20 are interconnected in parallel, thereby forming ladder type SAW filter 11. In the present embodiment, an electrode film forming the one-port surface acoustic wave resonator including the comb electrodes and the grating reflectors is made of aluminum (Al).

Input terminal 1 is connected to one comb electrode of surface acoustic wave resonator 15, and output terminal 2 is connected to one comb electrode of surface acoustic wave resonator 18. Ground terminals 3 and 4 are connected to one-side comb electrodes of surface acoustic wave resonators 19 and 20 interconnected in parallel. A wiring pattern 13 is formed to interconnect surface acoustic wave resonators 15 through 20, input terminal 1, output terminal 2, and ground terminals 3 and 4.

A silicon dioxide ($SiO_2$) film is formed as dielectric film 14 so as to cover only surface acoustic wave resonators 15 through 18 interconnected in series, of surface acoustic wave resonators 15 through 20 formed on piezoelectric substrate 12. The thickness of the $SiO_2$ film is set 20% of the wavelength of SAW filter 11. The optimal value of the thickness of the $SiO_2$ film depends on a required filter characteristic, so that the thickness is not limited to the above-mentioned value. Dielectric film 14 is not limited to the $SiO_2$ film. For example, zirconium oxide ($ZrO_2$), titanium oxide ($TiO_2$), magnesium oxide (MgO), silicon nitride ($Si_3N_4$), or tantalum pentoxide ($Ta_2O_5$) may be used as dielectric film 14. The $SiO_2$ film can significantly improve the temperature coefficient of frequency, and hence is a desired material.

Next, a manufacturing method of SAW filter 11 of the present embodiment is described with reference to FIG. 2A through FIG. 2E. FIG. 2A through FIG. 2E are schematic sectional views of a method of selectively forming dielectric film 14 on surface acoustic wave resonators in SAW filter 11.

Figure 2A:
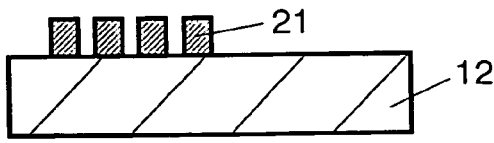
FIG. 2A through FIG. 2E are schematic sectional views of a method of selectively forming a dielectric film on a surface acoustic wave resonator in the SAW filter in accordance with the first exemplary embodiment.

First, in FIG. 2A, aluminum (Al) as the electrode film is formed on piezoelectric substrate 12 by sputtering or electron-beam (EB) evaporation, photolithography and an etching process are performed, and electrode pattern 21 of the comb electrodes and grating reflectors is formed.

Figure 2B:
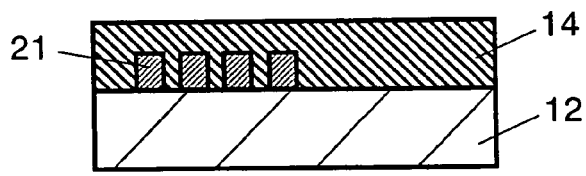

In FIG. 2B, a $SiO_2$ film is formed as dielectric film 14 on the whole surface using a radio-frequency (RF) sputtering method.

Figure 2C:
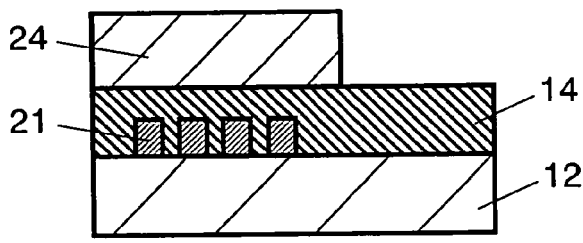

In FIG. 2C, of surface acoustic wave resonators 15 through 20 constituting SAW filter 11, only surface acoustic wave resonators 19 and 20 interconnected in parallel are covered with resist film 24.

Figure 2D:
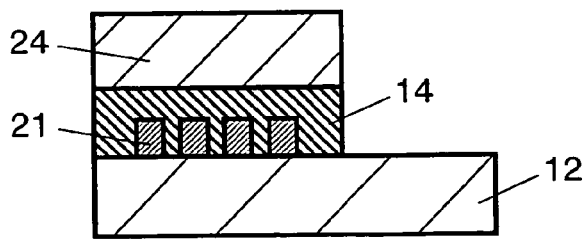

In FIG. 2D, dielectric film 14 in a region that is not covered with resist film 24 is etched and removed by dry etching.

Figure 2E:
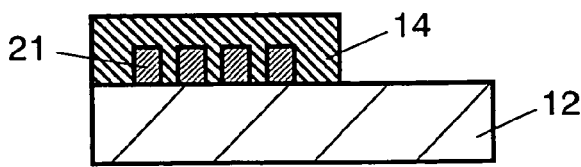

In FIG. 2E, resist film 24 is removed by ashing or the like. In these processes, SAW filter 11 shown in FIG. 1 can be manufactured.

The $SiO_2$ film is formed as dielectric film 14 by RF sputtering in the present embodiment; however, the present invention is not limited to this method. For example, a chemical vapor deposition (CVD) method, or a producing method such as ion plating may be used. The thickness is easily controlled because the deposition rate is stable in the RF sputtering method, so that the RF sputtering method is a deposition method suitable for producing dielectric film 14.

The $SiO_2$ film as dielectric film 14 is removed by dry etching in the present embodiment; however, it may be removed by wet etching or the like. Since dry etching is a dry-type process, the Al film or the like of electrode pattern 21 is not exposed to liquid when the $SiO_2$ film is etched. Therefore, corrosion or the like of the Al film hardly occurs, and SAW filter 11 can be produced with a good yield.

A comparison result of the characteristic of SAW filter 11 of the present embodiment with a SAW filter with a conventional structure is described hereinafter. Generally, a ladder type SAW filter provides a desired characteristic by superimposing the characteristics of the surface acoustic wave resonators on each other. Therefore, in the structure of FIG. 1, the characteristic of the SAW filter that has no $SiO_2$ film as dielectric film 14 on the surfaces of surface acoustic wave resonators 15 through 20 is compared with that of SAW filter 11 of the present embodiment.

SAW filter 11 of the present embodiment has the following structure. First, the $SiO_2$ film as dielectric film 14 is formed on the surfaces of surface acoustic wave resonators 15 through 18. Second, the resonance frequency of surface acoustic wave resonators 15 through 18 is set higher than that of surface acoustic wave resonators 19 and 20 having no dielectric film 14.

SAW filter 11 of the present embodiment is called an SAW filter of practical example 1, and the SAW filter with the conventional structure having no dielectric film 14 is called an SAW filter of comparative example 1 hereinafter.

Figure 3:
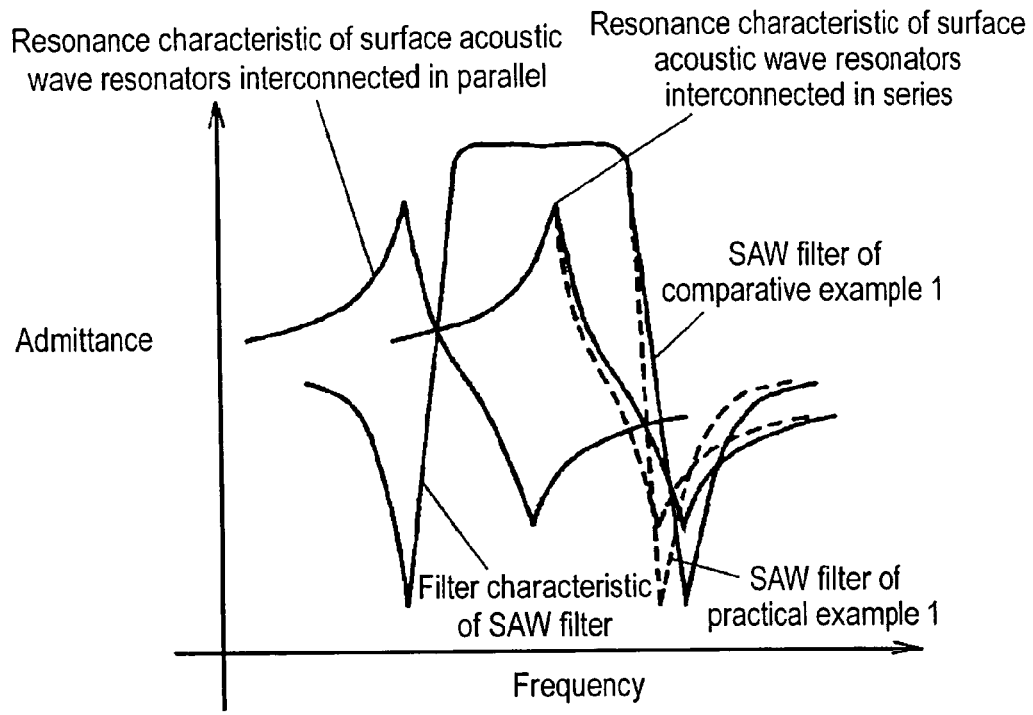
FIG. 3 is a diagram showing filter characteristics of a SAW filter of practical example 1 and a SAW filter of comparative example 1 in the first exemplary embodiment.

FIG. 3 is a diagram showing the filter characteristics of the SAW filter of practical example 1 and the SAW filter of comparative example 1. FIG. 3 shows admittance characteristics of surface acoustic wave resonator 15, of surface acoustic wave resonators 15 through 18 interconnected in series, and surface acoustic wave resonator 19, of surface acoustic wave resonators 19 and 20 interconnected in parallel, in the structures of the SAW filter of practical example 1 and the SAW filter of comparative example 1. In the SAW filter of practical example 1 and the SAW filter of comparative example 1, respective surface acoustic wave resonators 15 connected in series are different from each other, namely having dielectric film 14 or having no dielectric film 14, and respective surface acoustic wave resonators 19 connected in parallel have the same structure. The horizontal axis shows frequency, and the vertical axis shows admittance.

In FIG. 3, the SAW filter of comparative example 1 is shown by the solid line, and the SAW filter of practical example 1 is shown by the dotted line. The admittance characteristic on the low frequency side is a characteristic of surface acoustic wave resonator 19 connected in parallel, and the admittance characteristic on the high frequency side is a characteristic of surface acoustic wave resonator 15 connected in series. In SAW filter 11 of practical example 1, only surface acoustic wave resonators 15 through 18 interconnected in series have a $SiO_2$ film as dielectric film 14. As shown by FIG. 3, forming dielectric film 14 as in SAW filter 11 of practical example 1 improves the steepness in admittance characteristic on the high frequency side. That is because the capacitance ratio of surface acoustic wave resonator 15 having the $SiO_2$ film as dielectric film 14 is larger than that of surface acoustic wave resonator 19 having no dielectric film 14. Generally, assuming that the capacitance ratio of the resonators is γ, resonance frequency is fr, and anti-resonance frequency is far, these parameters satisfy the relation $\gamma=1/[(far/fr)^2-1]$.

In other words, the increase in capacitance ratio decreases the difference between the resonance frequency and anti-resonance frequency and provides a steep admittance characteristic. When the $SiO_2$ film as dielectric film 14 is formed only on surface acoustic wave resonators 15 through 18 interconnected in series, the resonance frequency of surface acoustic wave resonators 15 through 18 is set higher than that of surface acoustic wave resonators 19 and 20 having no dielectric film 14. Thanks to this setting, control can be performed so that the admittance characteristic on the high frequency side becomes steep and the filter characteristic of SAW filter 11 becomes steep on the high frequency side in the pass band.

Figure 4:
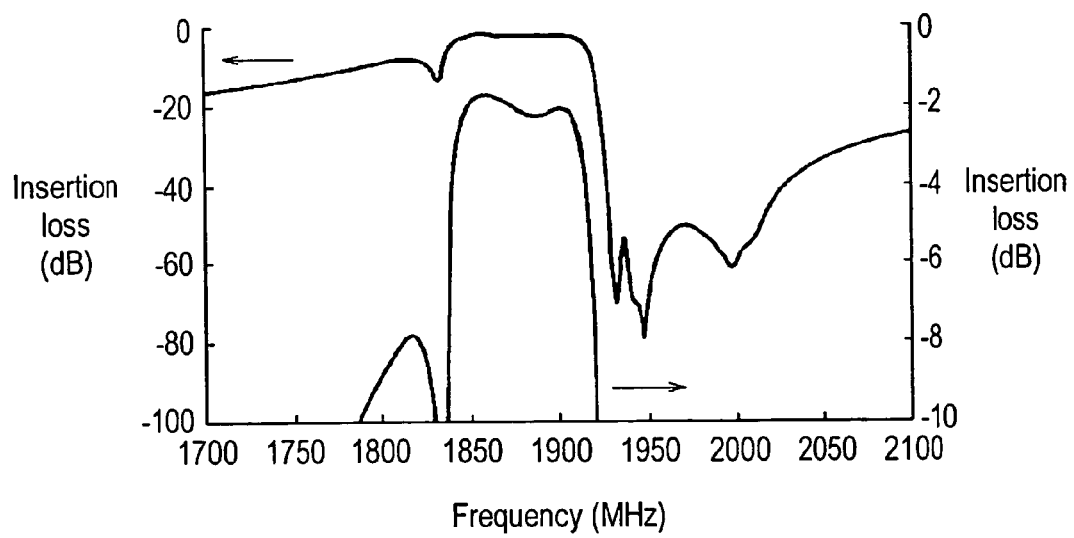
FIG. 4 is a diagram showing the filter characteristic of the SAW filter of practical example 1 in the first exemplary embodiment.

FIG. 4 is a diagram showing the filter characteristic of the SAW filter of practical example 1. The vertical axis shows insertion loss, and the horizontal axis shows frequency. As shown in FIG. 4, the pole on the high frequency side in the pass band becomes steep. The band width of the filter is apt to decrease with increase in capacitance ratio, but SAW filter 11 of practical example 1 can have 65 MHz, namely a sufficient pass band. That is because the $SiO_2$ film as dielectric film 14 is formed only on surface acoustic wave resonators 15 through 18 interconnected in series, of surface acoustic wave resonators 15 through 20 forming the ladder type filter.

The SAW filter of practical example 1 is a filter employing surface acoustic wave resonators 15 through 20 as impedance elements, so that the insertion loss in the pass band is 2.43 dB, namely small insertion loss.

The temperature coefficient of frequency of the SAW filter of practical example 1 is −22 ppm/° C. The temperature coefficient of frequency of the SAW filter of comparative example 1 is −40 through −35 ppm/° C. As a result, in the SAW filter of practical example 1, the temperature coefficient of frequency is recognized to be significantly improved.

The $SiO_2$ film as dielectric film 14 is formed on all of surface acoustic wave resonators 15 through 18 interconnected in series in the present embodiment; however, dielectric film 14 may be formed on only some of surface acoustic wave resonators 15 through 18 interconnected in series. A plurality of poles can be formed on the high frequency side, so that a sufficient attenuation can be easily secured in the pass band on the other party.

In FIG. 1, ladder type SAW filter 11 that is formed of a total of six surface acoustic wave resonators 15 through 20 of four surface acoustic wave resonators 15 through 18 interconnected in series and two surface acoustic wave resonators 19 and 20 interconnected in parallel has been described as an example. However, the present invention is not limited to this. The number and the structure of surface acoustic wave resonators interconnected in series and those of surface acoustic wave resonators interconnected in parallel depend on a required filter characteristic. In any case, an advantage similar to that of SAW filter 11 of the present embodiment can be obtained by applying the structure of the present invention.

A ladder type SAW filter has been described as an example in the present embodiment, but a similar advantage can be obtained in a coupled mode type SAW filter or the like.

Second Exemplary Embodiment

Figure 5:
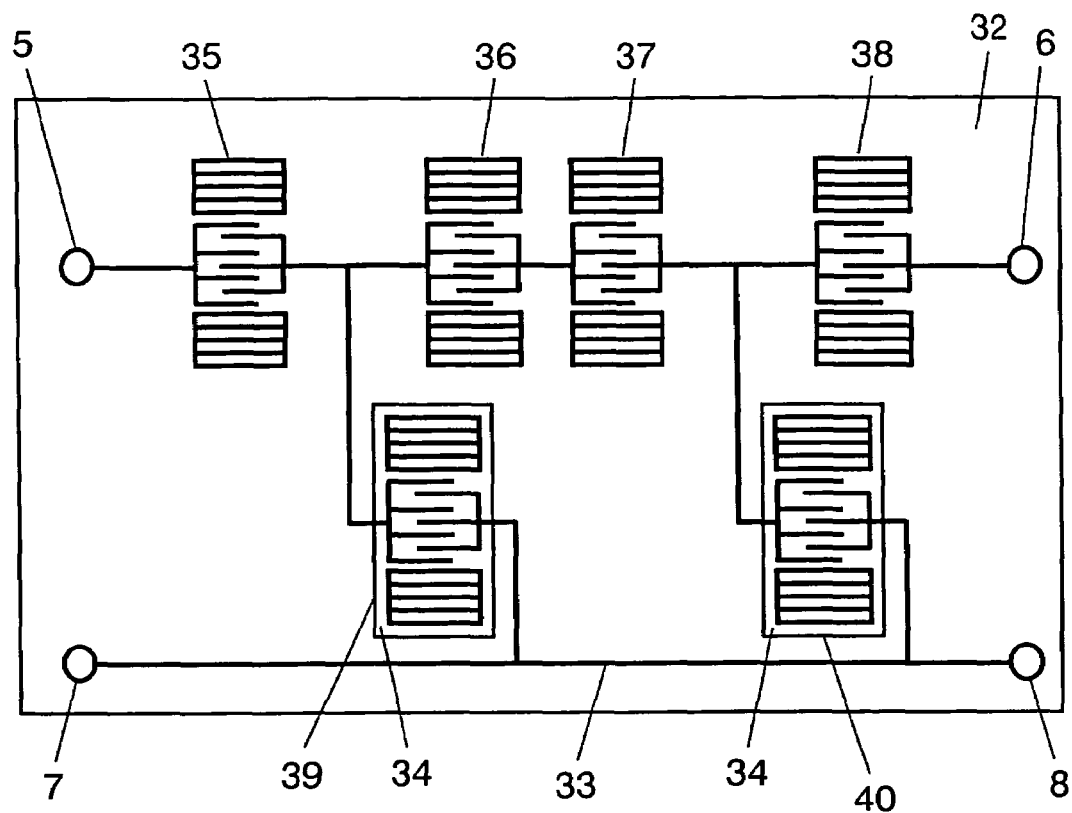
FIG. 5 is a plan view of a SAW filter in accordance with a second exemplary embodiment of the present invention.

FIG. 5 is a plan view of SAW filter 31 in accordance with a second exemplary embodiment of the present invention. Similarly to the first exemplary embodiment, as SAW filter 31 of the second exemplary embodiment, a ladder type filter where surface acoustic wave resonators 35 through 40 are interconnected in series and in parallel is described.

SAW filter 31 employs a 39° Y cut X propagation LiTaO$_3$ substrate as piezoelectric substrate 32. One-port surface acoustic wave resonators 35 through 40 having comb electrodes and grating reflectors are formed on piezoelectric substrate 32. Surface acoustic wave resonators 35 through 38 are interconnected in series, and surface acoustic wave resonators 39 and 40 are interconnected in parallel, thereby forming ladder type SAW filter 31.

In the present embodiment, the electrode film forming the one-port surface acoustic wave resonators that include the comb electrodes and the grating reflectors is made of aluminum (Al).

Input terminal 5 is connected to one comb electrode of surface acoustic wave resonator 35, and output terminal 6 is connected to one comb electrode of surface acoustic wave resonator 38. Ground terminals 7 and 8 are connected to one-side comb electrodes of surface acoustic wave resonators 39 and 40 interconnected in parallel. Wiring pattern 33 is formed to interconnect surface acoustic wave resonators 35 through 40, input terminal 5, output terminal 6, and ground terminals 7 and 8.

A SiO$_2$ film is formed as dielectric film 34 so as to cover only surface acoustic wave resonators 39 and 40 interconnected in parallel, of surface acoustic wave resonators 35 through 40 formed on piezoelectric substrate 32. The thickness of the SiO$_2$ film is set 20% of the wavelength of the SAW filter. The optimal value of the thickness of the SiO$_2$ film depends on a required filter characteristic, so that the thickness is not limited to the above-mentioned value. Dielectric film 34 is not limited to the SiO$_2$ film, but may employ materials described in the first embodiment.

SAW filter 31 of the present embodiment can be manufactured by a method similar to the manufacturing method described in the first embodiment. Therefore, in the present embodiment, the description of the manufacturing method is omitted.

A comparison result of the characteristic of SAW filter 31 of the present embodiment with that of the SAW filter with the conventional structure is described hereinafter. In the structure of FIG. 5, the characteristic of the SAW filter that don't have any SiO$_2$ film as dielectric film 34 on the surfaces of surface acoustic wave resonators 35 through 40 is compared with that of SAW filter 31 of the present embodiment. SAW filter 31 of the present embodiment has the following structure. The SiO$_2$ film as dielectric film 34 is formed on the surfaces of surface acoustic wave resonators 39 and 40. The resonance frequency of surface acoustic wave resonators 39 and 40 is set lower than that of surface acoustic wave resonators 35 through 38 having no dielectric film 34.

SAW filter 31 of the present embodiment is called a SAW filter of practical example 2, and the SAW filter with the conventional structure having no dielectric film 34 is called a SAW filter of comparative example 2 hereinafter.

Figure 6:
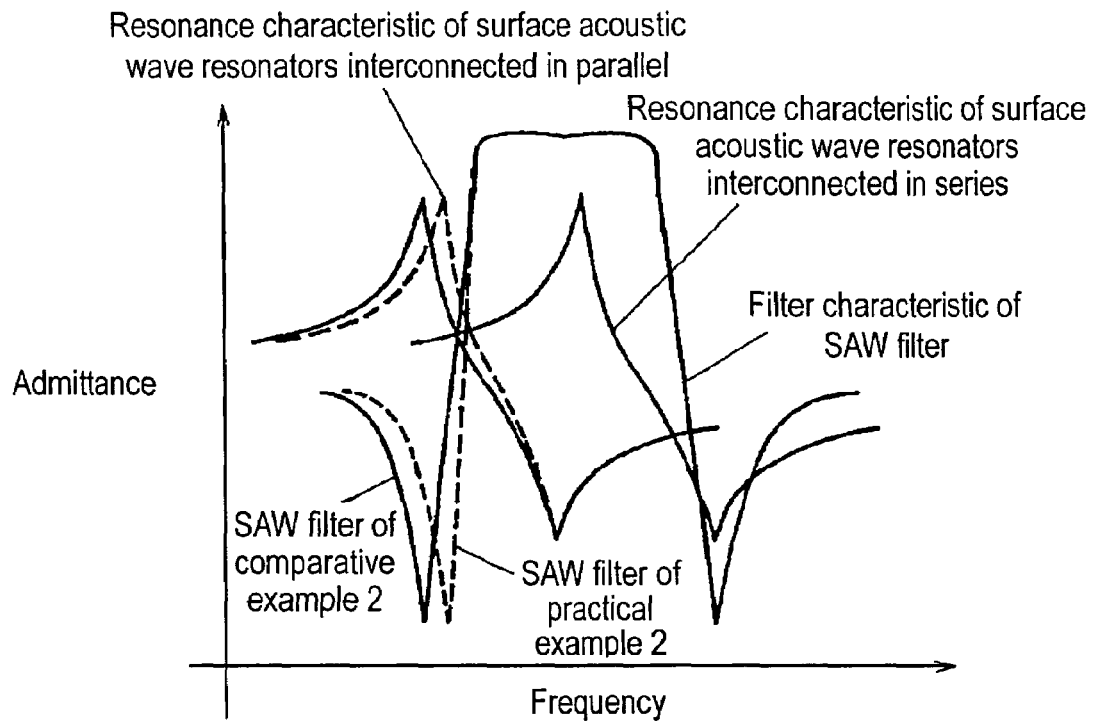
FIG. 6 is a diagram showing filter characteristics of a SAW filter of practical example 2 and a SAW filter of comparative example 2 in the second exemplary embodiment.

FIG. 6 is a diagram showing the filter characteristics of SAW filter 31 of practical example 2 and the SAW filter of comparative example 2. FIG. 6 shows admittance characteristics of surface acoustic wave resonator 35, of surface acoustic wave resonators 35 through 38 interconnected in series, and surface acoustic wave resonator 39, of surface acoustic wave resonators 39 and 40 interconnected in parallel, in the structure of each of the SAW filter of practical example 2 and the SAW filter of comparative example 2. In SAW filter 31 of practical example 2 and the SAW filter of comparative example 2, respective surface acoustic wave resonators 35 connected in series have the same structure, and respective surface acoustic wave resonators 39 connected in parallel are different from each other, namely having dielectric film 34 or having no dielectric film 34. The horizontal axis shows frequency, and the vertical axis shows admittance.

In FIG. 6, the SAW filter of comparative example 2 is shown by the solid line, and the SAW filter of practical example 2 is shown by the dotted line. The admittance characteristic on the low frequency side is a characteristic of surface acoustic wave resonator 39 connected in parallel, and the admittance characteristic on the high frequency side is a characteristic of surface acoustic wave resonator 35 connected in series.

In the SAW filter of practical example 2, only surface acoustic wave resonators 39 and 40 interconnected in parallel have a SiO$_2$ film as dielectric film 34. As shown by FIG. 6, forming dielectric film 34 improves the steepness in admittance characteristic on the low frequency side. That is because the capacitance ratio of surface acoustic wave resonators 39 and 40 having the SiO$_2$ film as dielectric film 34 is larger than that of surface acoustic wave resonators 35 through 38 having no dielectric film 34. Generally, assuming that the capacitance ratio of the resonators is γ, resonance frequency is fr, and anti-resonance frequency is far, these parameters satisfy the relation $\gamma = 1/[(far/fr)^2 - 1]$.

Figure 7:
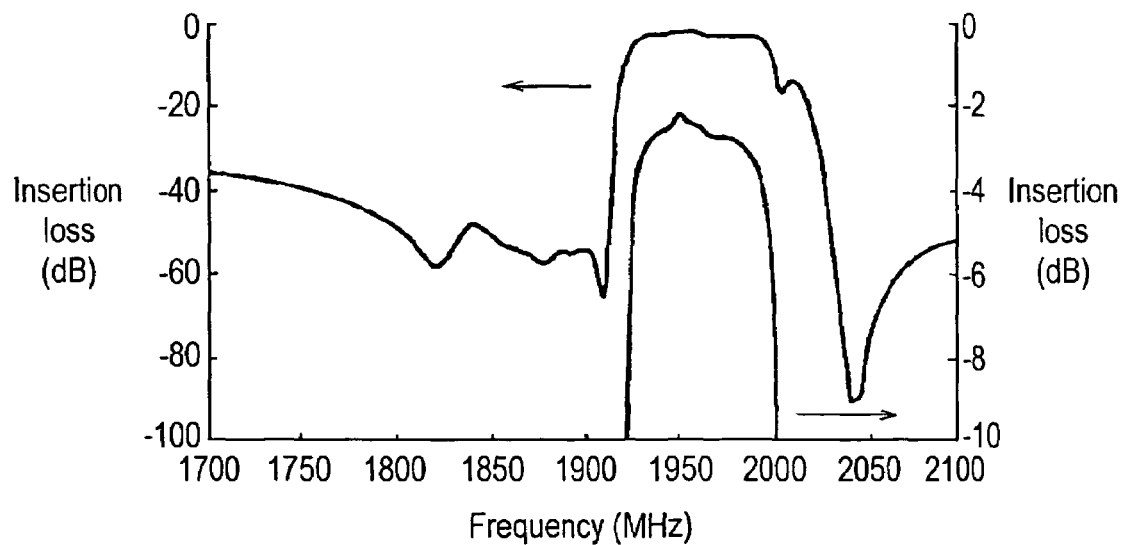
FIG. 7 is a diagram showing the filter characteristic of the SAW filter of practical example 2 in the second exemplary embodiment.

In other words, the increase in capacitance ratio decreases the difference between the resonance frequency and anti-resonance frequency, and provides a steep admittance characteristic. When the SiO$_2$ film as dielectric film 34 is formed only on surface acoustic wave resonators 39 and 40 interconnected in parallel, the resonance frequency of surface acoustic wave resonators 39 and 40 is set lower than that of surface acoustic wave resonators 35 through 38 having no dielectric film 34. Thanks to this setting, control can be performed so that the admittance characteristic on the low frequency side becomes steep and the filter characteristic of SAW filter 31 becomes steep on the low frequency side in the pass band. FIG. 7 is a diagram showing the filter characteristic of the SAW filter of practical example 2. The vertical axis shows insertion loss, and the horizontal axis shows frequency. As shown in FIG. 7, the pole on the low frequency side in the pass band becomes steep.

The band width of the SAW filter is apt to decrease with increase in capacitance ratio, but the SAW filter of practical example 2 can have 60 MHz, namely a sufficient pass band. The SAW filter of practical example 2 is a filter employing surface acoustic wave resonators 35 through 40 as impedance elements, so that the insertion loss in the pass band is 3.43 dB, namely small insertion loss.

The temperature coefficient of frequency of the SAW filter of practical example 2 is −22 ppm/° C. The temperature coefficient of frequency of the SAW filter of comparative example 2 is −40 through −35 ppm/° C. As a result, in the SAW filter of practical example 2, the temperature coefficient of frequency is recognized to be significantly improved.

The $SiO_2$ film as dielectric film 34 is formed on both of two surface acoustic wave resonators 39 and 40 interconnected in parallel in the present embodiment. However, dielectric film 34 may be formed on only one of surface acoustic wave resonators 39 and 40 interconnected in parallel. A plurality of poles can thus be formed on the low frequency side, so that a sufficient attenuation can be easily secured in the pass band on the other party.

The number of surface acoustic wave resonators interconnected in parallel is not limited to two, but may be three or more. In this case, dielectric film 34 may be formed on one or more of a plurality of surface acoustic wave resonators interconnected in parallel.

The ladder type SAW filter that is formed of a total of six surface acoustic wave resonators of four surface acoustic wave resonators interconnected in series and two surface acoustic wave resonators interconnected in parallel has been described as an example in the present embodiment. However, the present invention is not limited to this. For example, the number and the structure of surface acoustic wave resonators interconnected in series and those of surface acoustic wave resonators interconnected in parallel depend on a required filter characteristic. In any case, an advantage similar to that of SAW filter 31 of the present embodiment can be obtained by applying the structure of the present invention.

Third Exemplary Embodiment

Figure 8:
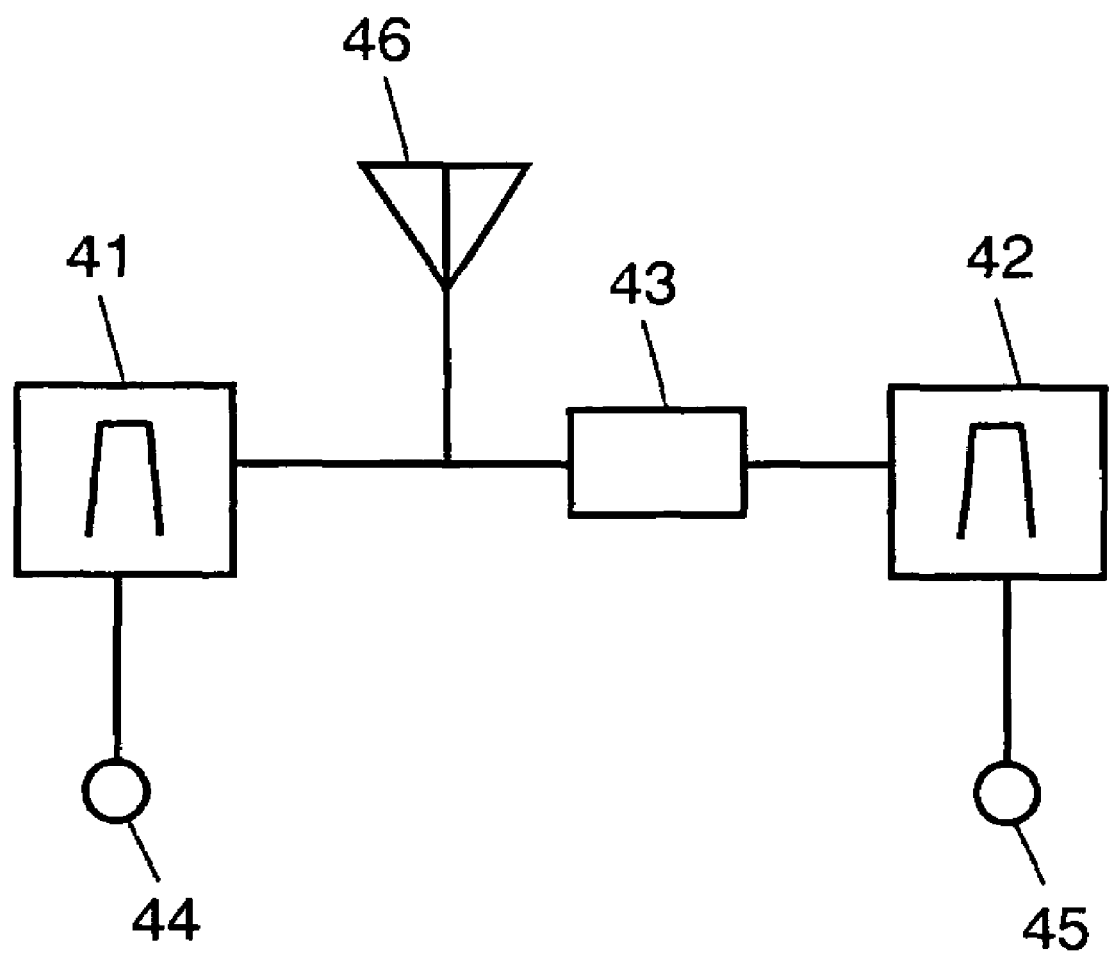
FIG. 8 is a circuit block diagram showing the circuitry of a SAW duplexer in accordance with a third exemplary embodiment of the present invention.

FIG. 8 is a circuit block diagram showing the circuitry of a SAW duplexer in accordance with a third exemplary embodiment of the present invention. The fundamental structure of the SAW duplexer has transmission filter 41, reception filter 42, and phase shifter 43. Transmission terminal 44 is connected to transmission filter 41, reception terminal 45 is connected to reception filter 42, and antenna terminal 46 is disposed between transmission filter 41 and reception filter 42.

For realizing such a SAW duplexer, the frequency characteristic must be steep in the cross band. For example, when frequency allocation where the transmission band lies on the low frequency side and the reception band lies on the high frequency side is employed as in a PCS system, transmission filter 41 is required to have a steep filter characteristic on the high frequency side. Reception filter 42 is required to have a steep filter characteristic on the low frequency side. Therefore, these requirements can be satisfied when the SAW filter of the first embodiment is used as transmission filter 41 and the SAW filter of the second embodiment is used as reception filter 42.

Thanks to this structure, the insertion loss of SAW filter 11 used as transmission filter 41 is small, namely 2.43 dB, as shown in FIG. 4, the attenuation on the high frequency side is about 50 dB, and a large suppression can be achieved in the pass band on the other party. As a result, SAW filter 11 has a characteristic good enough for transmission filter 41 of the SAW duplexer. The insertion loss of SAW filter 31 used as the reception filter is small, namely 3.43 dB, as shown in FIG. 7, the attenuation on the low frequency side is about 50 dB, and a large suppression can be achieved in the pass band on the other party. As a result, SAW filter 31 has a characteristic good enough for reception filter 42 of the SAW duplexer.

Thus, using the SAW filters of the first and second embodiments, a SAW duplexer having a good characteristic even in a narrow cross band can be realized.

In the present embodiment, especially, the frequency allocation in a PCS system, or the like, where the transmission band lies on the low frequency side and the reception band lies on the high frequency side has been described. However, also in a system having a frequency allocation where the transmission band lies on the high frequency side and the reception band lies on the low frequency side, transmission filter 41 is required to have a steep filter characteristic on the low frequency side, and reception filter 42 is required to have a steep filter characteristic on the high frequency side. In this system, the SAW filter of the second embodiment is used as transmission filter 41 and the SAW filter of the first embodiment is used as reception filter 42. Thus, a SAW duplexer having a good characteristic can be realized.

INDUSTRIAL APPLICABILITY

A SAW filter and a SAW duplexer using it of the present invention have an excellent temperature coefficient of frequency and a small insertion loss into a pass band. This SAW filter enables achievement of a high-performance SAW duplexer that has a steep filter characteristic in a narrow cross band and has a large suppression in the pass band on the other party. The SAW filter is useful in a mobile communication field of a portable phone, or the like.

The invention claimed is:

1. A surface acoustic wave filter comprising:
    a plurality of surface acoustic wave resonators including a comb electrode and a grating reflector coupled on a piezoelectric substrate, and
    a dielectric film formed on a surface of at least one of the surface acoustic wave resonators,
    wherein the dielectric film is not formed on a surface of at least one other of the surface acoustic wave resonators, and
    wherein a capacity ratio of the at least one surface acoustic wave resonator having the dielectric film is set higher than a capacity ration of the at least one other surface acoustic wave resonator having no dielectric film.

2. The surface acoustic wave filter of claim 1,
    wherein a resonance frequency of the at least one surface acoustic wave resonator having the dielectric film is set higher than that of the at least one other surface acoustic wave resonator having no dielectric film.

3. The surface acoustic wave filter of claim 1,
    wherein a resonance frequency of the at least one surface acoustic wave resonator having the dielectric film is set lower than that of the at least one other surface acoustic wave resonator having no dielectric film.

4. The surface acoustic wave filter of claim 1,
    wherein the surface acoustic wave resonators are coupled in series and in parallel to form a ladder type filter structure, and
    wherein the dielectric film is formed on at least one of the surface acoustic wave resonators coupled in series or on at least one of the surface acoustic wave resonators coupled in parallel.

5. The surface acoustic wave filter of claim 1, wherein the dielectric film is a silicon dioxide film.

6. A surface acoustic wave (SAW) duplexer employing the surface acoustic wave filter of claim 1.

7. A surface acoustic wave (SAW) duplexer comprising:
a transmission filter;
a reception filter; and
a phase shifter,
wherein each of the transmission filter and reception filter has a ladder type structure where surface acoustic wave resonators are coupled in series and in parallel,
wherein depending on which side of each pass band requires a steeper filter characteristic, a dielectric film is formed on at least one of the surface acoustic wave resonators coupled in series or on at least one of the surface acoustic wave resonators coupled in parallel,
wherein the SAW duplexer has a frequency allocation where a transmission band lies on a low frequency side and a reception band lies on a high frequency side,
wherein the transmission filter has a structure where the dielectric film is formed on a surface of at least one of the surface acoustic wave resonators coupled in series, and
wherein the reception filter has a structure where the dielectric film is formed on a surface of at least one of the surface acoustic wave resonators coupled in parallel.

8. A surface acoustic wave (SAW) duplexer comprising:
a transmission filter;
a reception filter; and
a phase shifter,
wherein each of the transmission filter and reception filter has a ladder type structure where surface acoustic wave resonators are coupled in series and in parallel,
wherein depending on which side of each pass band requires a steeper filter characteristic, a dielectric film is formed on at least one of the surface acoustic wave resonators coupled in series or on at least one of the surface acoustic wave resonators coupled in parallel,
wherein the SAW duplexer has a frequency allocation where a transmission band lies on a high frequency side and a reception band lies on a low frequency side,
wherein the transmission filter has a structure where the dielectric film is formed on a surface of at least one of the surface acoustic wave resonators coupled in parallel, and
wherein the reception filter has a structure where the dielectric film is formed on a surface of at least one of the surface acoustic wave resonators coupled in series.

* * * * *

UNITED STATES PATENT AND TRADEMARK OFFICE
CERTIFICATE OF CORRECTION

PATENT NO. : 7,498,898 B2  Page 1 of 1
APPLICATION NO. : 10/587240
DATED : March 3, 2009
INVENTOR(S) : Hidekazu Nakanishi et al.

It is certified that error appears in the above-identified patent and that said Letters Patent is hereby corrected as shown below:

In column 10, claim 1, line 47, "ration" should read --ratio--.

Signed and Sealed this

Eleventh Day of August, 2009

David J. Kappos
*Director of the United States Patent and Trademark Office*